[19] United States Patent
Baker

[11] 4,210,826
[45] Jul. 1, 1980

[54] SWITCHING CIRCUIT
[75] Inventor: Richard H. Baker, Bedford, Mass.
[73] Assignee: Exxon Research & Engineering Co., Florham Park, N.J.
[21] Appl. No.: 944,633
[22] Filed: Sep. 21, 1978
[51] Int. Cl.[2] .......................................... H03K 17/00
[52] U.S. Cl. .................... 307/254; 307/237; 307/270; 307/315
[58] Field of Search ............... 307/254, 255, 270, 272, 307/237, 315; 330/207 P, 298, 296, 263

[56] References Cited
U.S. PATENT DOCUMENTS

| | | | |
|---|---|---|---|
| 3,227,889 | 1/1966 | Paynter | 307/254 |
| 3,622,899 | 11/1971 | Eisenberg | 330/363 |
| 3,710,147 | 1/1973 | Lee | 307/254 |
| 3,961,280 | 1/1976 | Sample | 330/296 |

Primary Examiner—Stanley D. Miller, Jr.
Assistant Examiner—B. P. Davis
Attorney, Agent, or Firm—Kenneth Watov

[57] ABSTRACT

First through fourth NPN switching transistors having bases receptive of first through fourth control signals, respectively, are connected in cascode between a first terminal, for receiving an operating voltage $+E_1$, and a second terminal for receiving a source of reference potential. The common connection between the second and third transistors is connected to an output terminal. A first diode is connected between a third terminal for receiving a clamping voltage $+E_2$ and the common connection between the uppermost first and second transistors, the diode being polarized for clamping this common connection from not going lower than $+E_2$ volts. A second diode is connected between the third terminal and the common connection between the lowermost third and fourth transistors, this second diode being polarized for clamping its associated common connection to a maximum voltage of $+E_2$ volts. The difference between the operating and clamping voltages $(E_1-E_2)$ is set to be less than the $V_{CEX}$ of the four transistors (breakdown voltage from collector to emitter with some backbias voltage on the base), thereby permitting the switching of an operating voltage or load voltages that are substantially greater than the $V_{CEX}$ rating of the transistors. In one switching state only the second and third transistors are turned on for providing bidirectional current flow between the voltage source of $+E_2$ volts and a load connected to the output terminal.

15 Claims, 7 Drawing Figures

STATE 1  STATE 2  STATE 3
(A)      (B)      (C)

STATE 4  STATE 5  STATE 6
(D)      (E)      (F)

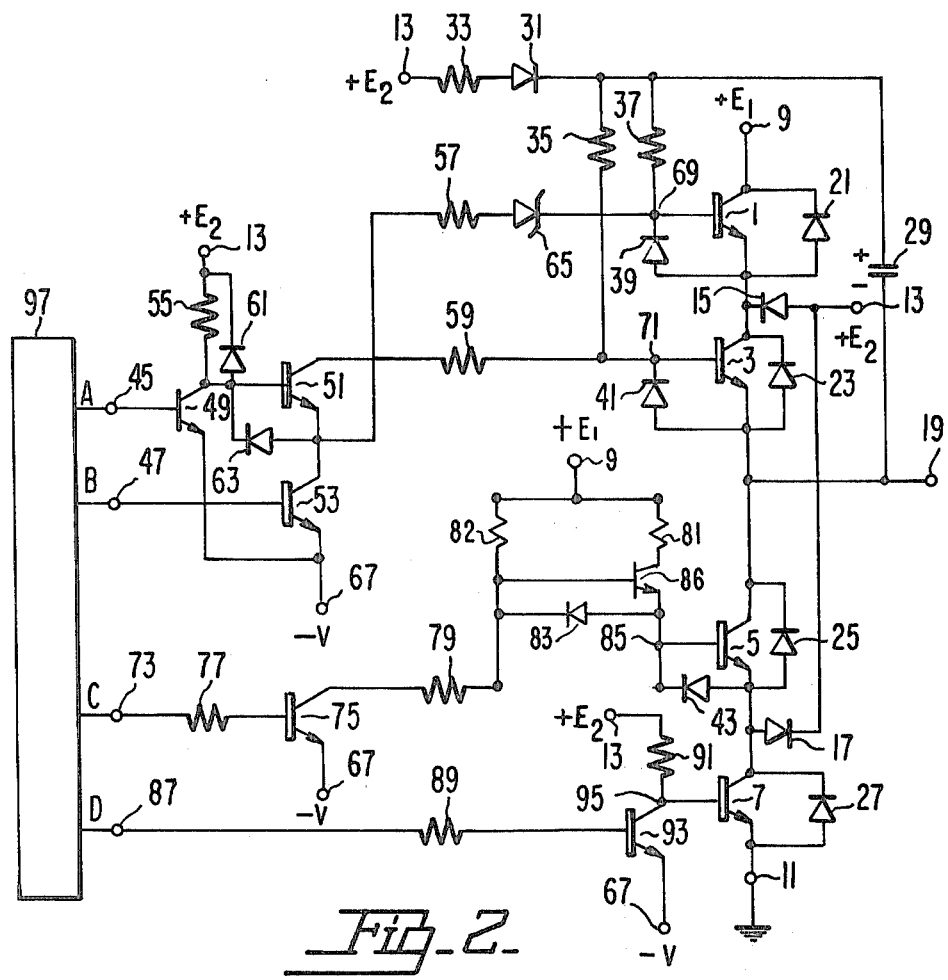
_Fig_2_
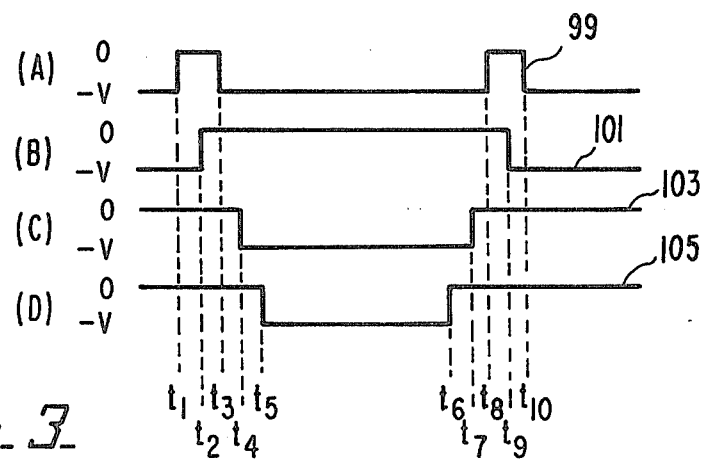
_Fig_3_

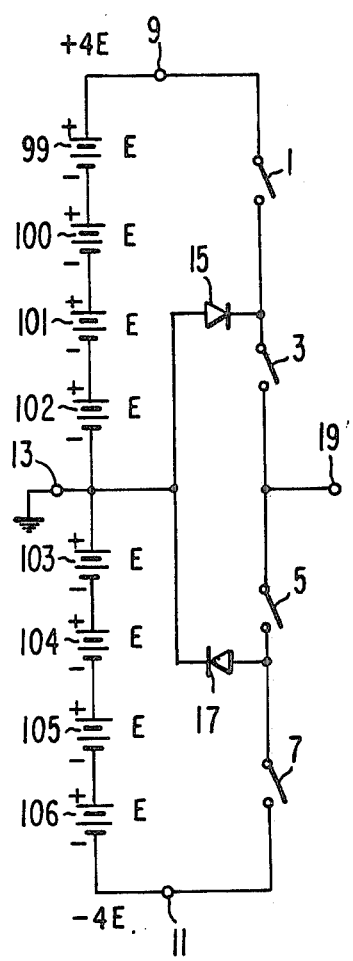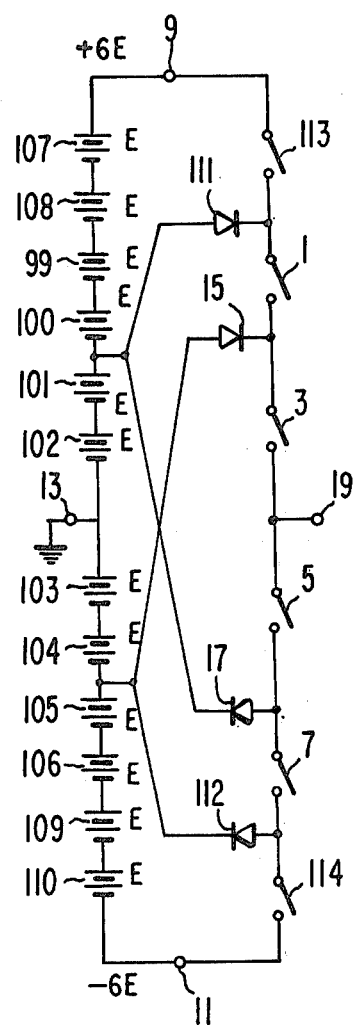
Fig_4_   Fig_5_

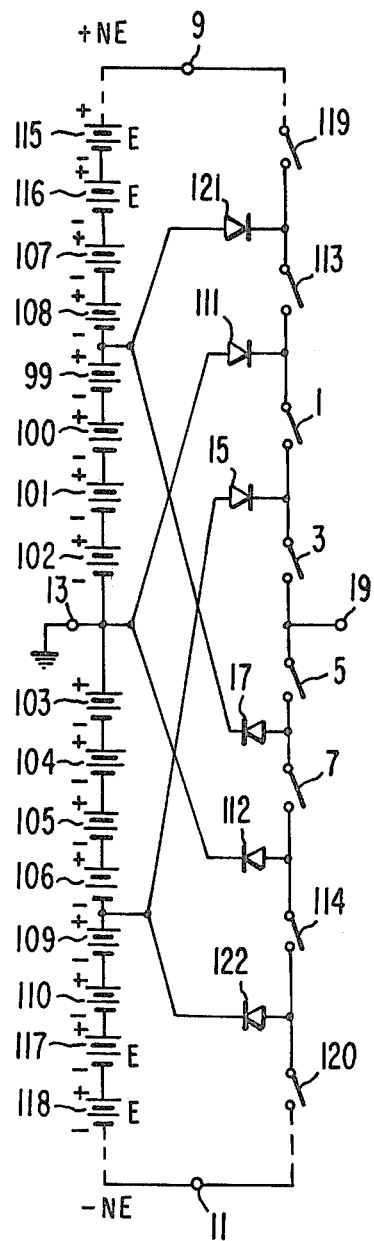
Fig_6.

SWITCHING CIRCUIT

The field of the present invention relates generally to transistor switching circuits, and more specifically to such circuits for switching voltages substantially in excess of the voltage rating of the switching transistors of the circuit.

Power transistors of present technology available for practical high power switching applications are limited to switching voltages having levels below 600 volts. In order to switch voltages in excess of 600 volts, circuits in the prior art include the series stacking of power transistor units to limit the transistor voltage. Such series stacking of power transistors requires that both the static and dynamic parameters of the high-voltage switching transistors be very closely matched. This matching requirement reduces the reliability of the circuits and increases the cost.

The present invention overcomes the problems in the prior art nonlinear amplifier of switching circuits via the cascoding of first through fourth power transistors, for example, between a first terminal for receiving an operating voltage and a second terminal for connection to a source of reference potential, with oppositely polarized diodes individually connected between a source of clamping voltage and a common connection between the uppermost two transistors and the lowermost two transistors, respectively, for clamping the upper common connection point to voltage levels below that of the clamping voltage, and the lower common connection point to voltage levels above the clamping voltage. The difference in voltage between the operating and clamping voltages is made less than the $V_{CEX}$ voltage rating of the transistors, thereby permitting the switching of an operating voltage substantially greater than the voltage rating of the transistors to a load connected to the common connection between the centralmost two transistors, and the switching of a load voltage substantially in excess of the rating of the transistors to the source of reference potential via the lowermost two transistors. The turning on of only the centralmost two transistors provides for bidirectional current flow between the source of clamping voltage and load.

In the drawings, where common elements are designated by the same reference designation:

FIG. 2 shows a circuit schematic diagram of a transistorized switching circuit or nonlinear amplifier including the embodiment of the invention of FIG. 1; and FIG. 3 shows a timing diagram of typical control signals in views (A), (B), (C) and (D) for operating the transistorized switching circuit of FIG. 2 in a predetermined sequence of switching states;

FIGS. 4, 5 and 6 are circuit schematic diagrams of alternative embodiments of the invention for switching successively higher voltages, respectively, and FIG. 7 is a circuit schematic diagram of a floating transistorized switch for providing each one of the single-pole-single-throw switches in each embodiment of the invention.

Figure 1:
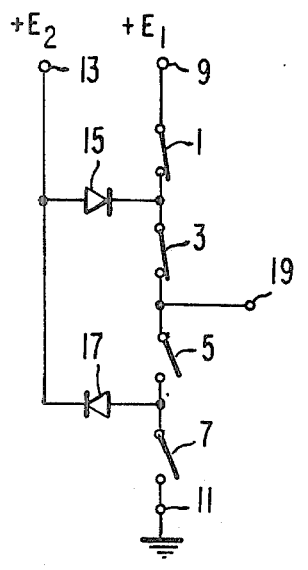
FIG. 1 is a circuit schematic diagram of one embodiment of the invention, showing the six possible operational or switching states of this embodiment in views (A), (B), (C), (D), (E), and (F)
Figure 1:
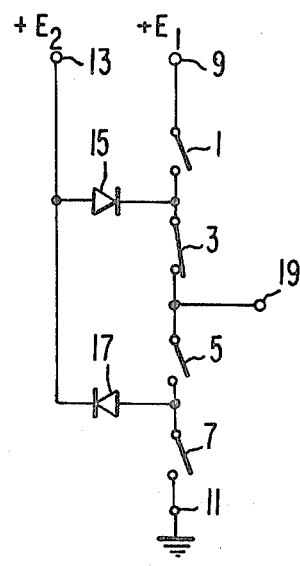
Figure 1:
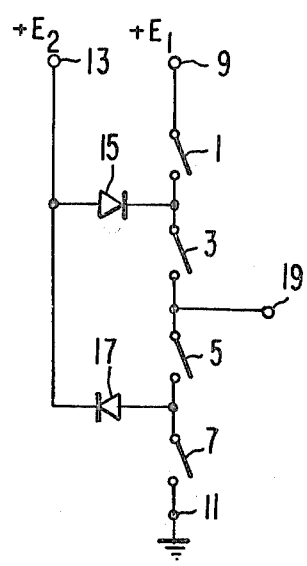
Figure 1:
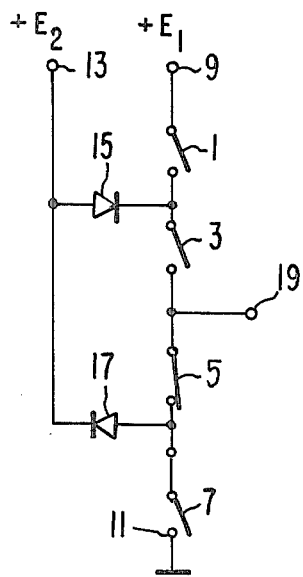
Figure 1:
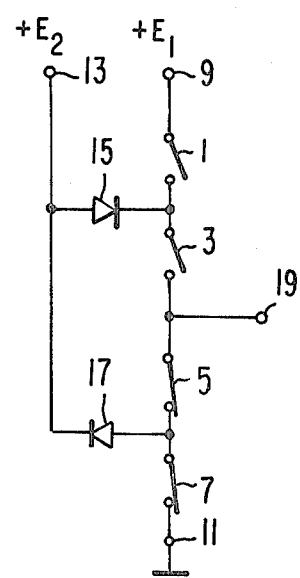
Figure 1:
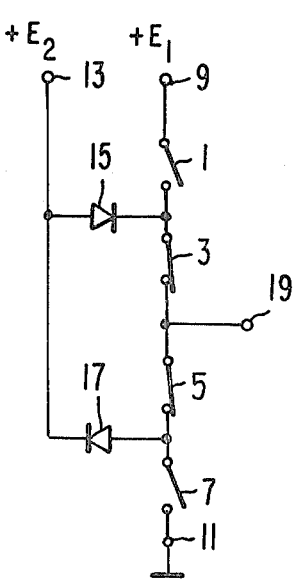
Figure 1:
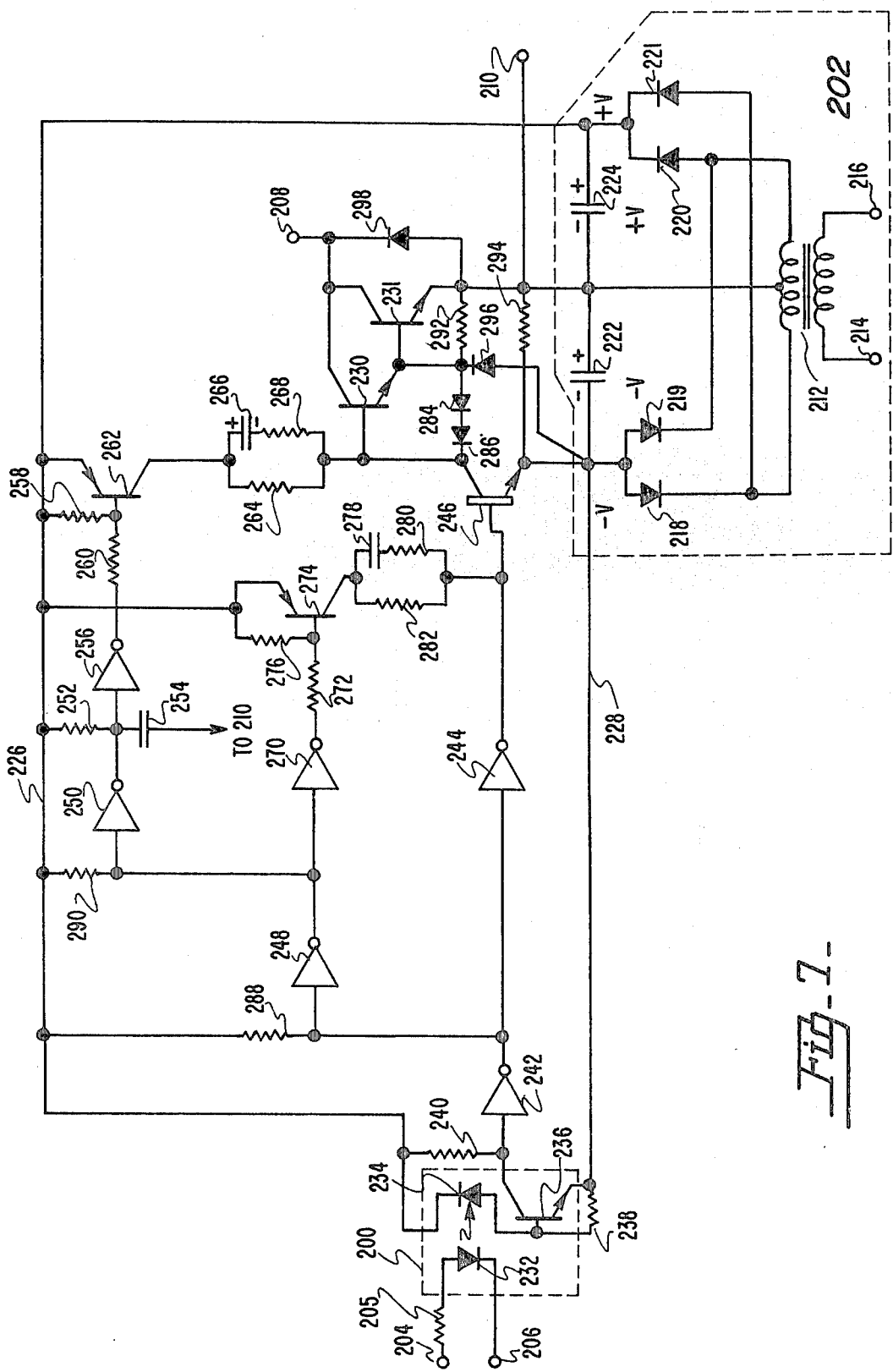

In FIG. 1(A), one embodiment of the invention, for example, includes four like conductivity transistors 1,3,5,7 shown as single-pole-single-throw switches for simplicity, connected in cascode between a first terminal 9 for receiving an operating voltage $+E_1$, and a second terminal 11 for receiving a source of reference potential, ground in this example. A third terminal 13, for receiving a clamping voltage $+E_2$, is connected via oppositely polarized diodes 15,17, to the common connection between the uppermost two transistors 1,3, and the lowermost two transistors 5,7, respectively. An output terminal 19 is connected to the common connection between transistors 3,5. The circuit connections of FIG. 1(A) as shown are identical to the circuits of FIGS. 1(B) through (F). Each one of the switches 1,3,5,7 represent the collector-emitter current path of a switching transistor, whereby if the transistors are of NPN conductivity, for example, when their base-emitter junctions are forwardbiased and sufficient current is supplied to their base electrodes, such switching transistors go into saturation for providing a substantially low impedance between their respective collector and emitter electrodes, analogous to a closed electromechanical switch. When their base-emitter junctions are reversebiased, the transistors cut off or turn off, substantially increasing the impedance between their respective collector and emitter electrodes, analogous to an opened switch. One voltage rating of a transistor is the breakdown voltage from the collector-to-emitter electrodes with some backbias voltage applied to the base of the transistor (commonly designated $V_{CEX}$). In the present state of the art, the highest voltage transistors available are of NPN conductivity, having a $V_{CEX}$ rating of about 600 volts. In the present invention, the difference between the operating voltage $+E_1$ and $+E_2$ is made less than the $V_{CEX}$ rating of the transistors 1,3,5 and 7, permitting these transistors to switch voltages substantially greater than their $V_{CEX}$ rating, as will be described.

For purposes of discussion, assume that the operating voltage $+E_1$ has a level of $+1200$ volts, for example. If in FIG. 1, NPN conductivity transistors having a $V_{CEX}$ rating of at least 600 volts are employed, then the clamping voltage $+E_2$ must be provided to have a level of $+600$ volts which is equal to one-half of $E_1$, in this example. Accordingly, diode 15 clamps the common connection between switches 1 and 3 from decreasing to a voltage level below $+E_2$, $+600$ volts in this example. Diode 17 serves to clamp the common connection between switches or transistors 5 and 7 to a level of voltage not exceeding $+600$ volts in this example. Accordingly, regardless of whether the combination of transistors 1,3,5 and 7 are placed in either one of states 1 through 6, the voltage across the collector-emitter current path of each one of these transistors cannot exceed 600 volts. In this manner, in state 1, 600 volt transistors can be employed for switching an operating voltage $+E_1$ of $+1200$ volts to a load connected to terminal 19 or in state 5 for switching a load voltage of $+1200$ volts, from the load to ground. It should be noted, as would be obvious to one skilled in the art, that when a transistor is conducting in saturation, the voltage drop across its collector-emitter current path is generally in the order to 1 volt because of the substantially low impedance of this current path in a saturation state of the transistor. Also, this method of operation does not require close matching of the transistors 1,3,5 and 7.

Another embodiment of the invention is provided by the clamping diodes 15,17, when the combination of the transistors 1,3,5 and 7 is in state 6. In this state, bidirectional current flow is provided between the clamping voltage supply providing $+E_2$ volts at terminal 13 and the load connected to output terminal 19. Also, the combination of diode 15 and transistor 3 provides a gated current path for the flow of current from terminal 13 to output terminal 19, whenever the combination of transistors is in state 2. Similarly, the combination of diode 17 and transistor 5 provides a gated current path for the flow of current from output terminal 19 to clamping terminal 13, whenever the combination of transistors 1,3,5 and 7 is in state 4.

States 1 through 6 are the only useful states for the combination of transistors 1,3,5 and 7. If all of the transistor switches 1,3,5 and 7 are each turned on, the operating voltage supply providing the operating voltage $+E_1$ will be shorted to the source of reference voltage connected to terminal 11, causing excessive current to flow through the transistors and their destruction. Accordingly, this latter state must be avoided at all times. To avoid operation of the transistors into such a forbidden state, it is desirable to provide control signals to the transistors 1,3,5 and 7, for providing break-before-make switching from one state to another.

If the winding of a DC motor (not shown), for example, is connected between output terminal 19 and 13, it is preferred that the combination of transistors 1,3,5 and 7 be operated into any one of states 1–5 in sequential and ascending or descending order. In such an application, the transistors could be held in state 3 for a relatively short period of time in switching the transistors from state 1 to state 5, for dynamically braking the motor, for example. It is necessary in many applications, such as driving a motor, to provide antiparallel diodes across the switches 1,3,5 and 7 as shown in and described for FIG. 2, but which for simplicity are not shown in FIG. 1. In this manner, since the motor winding represents an inductive load which can become highly charged, the sequential switching operation of the transistors substantially reduces the effects of the inductive kickback voltage from the motor winding, thereby preventing damage to the motor and stressing of the transistors. Similarly, sequential switching is preferred when the switching circuit is coupled to any complex impedance load, such as an inductor or capacitor, where in one state the switching circuit may be supplying current to the load, and in another state sinking current from the load.

In FIG. 2, a nonlinear switching amplifier is shown, including the embodiment of the invention of FIG. 1. The switching transistors 1,3,5 and 7 are provided by NPN Darlington switches, in this example. The diodes 21,23,25 and 27, connected in inverse parallel with the Darlington switches 1,3,5 and 7, respectively, provide for bilateral switching as would be known to one skilled in the art. Capacitor 29 provides in combination with diode 31 and resistors 33,35 and 37 a bootstrapping circuit for providing drive means for turning on Darlington transistors 1 and 3. The diodes 39,41 and 43 insure that a reverse bias voltage of at least one diode drop is applied across the base-emitter electrodes of switches 1,3,5 and 7, whenever a negative voltage of appropriate amplitude is applied to the base electrodes of these transistor switches, for turning them off or maintaining them turned off.

A first buffer switching amplifier includes input terminals 45,47, NPN switching transistor 49, NPN Darlington switches 51,53, resistors 55,57,59,33,35 and 37, diodes 31, 61,63, Zener diode 65, and terminal 67 for receiving a bias voltage $-V$. This first buffer switching amplifier can be considered to have pseudo output terminals at circuit points 69 and 71 for providing control or voltage signals, for operating Darlingtons 1,3, respectively.

A second buffer switching amplifier includes an input terminal 73, an NPN Darlington switch 75, resistors 77,79 and 81, and a pseudo output terminal at circuit point 85 for providing a control voltage or signal for operating Darlington switch 5.

A third buffer switching amplifier includes an input terminal 87, resistors 89 and 91, Darlington switch 93, and a pseudo output terminal at circuit point 95, for supplying control or voltage signals for operating the Darlington switch 7.

A controller 97 is used for producing first through fourth sequencing or input signals (A), (B), (C), (D), for application to the input terminals 45,47,73 and 87, respectively, for operating the switching circuit into various ones of the states 1 through 6, shown in FIG. 1. The controller 97 can be a microprocessor programmed for producing a particular combination or combinations of levels of input signals (A), (B), (C), and (D), such as shown in FIG. 3, for example, and as will be described below. The controller 97 can be other than a microprocessor, such as a configuration of four single-pole-double-throw switches wired for connecting selectively either $-V$ volts or ground to the input terminals 45,47,73 and 87, respectively, for operating the switching circuit into a desired one of its six states, as would be obvious to one skilled in the art from the following description of the operation of the circuit.

Table I shows the voltage or signal levels required for input signals A,B,C,D from controller 97, for operating the nonlinear switching amplifier of FIG. 2 into one of the six possible operating states for the combination of Darlingtons 1,3,5 or 7, as shown in FIG. 1.

TABLE I

| Circuit State | Input Signal Level | | | | Operating State of Devices | | | | | | | | | Output Level Or Condition |
|---|---|---|---|---|---|---|---|---|---|---|---|---|---|---|
| | A | B | C | D | 49 | 51 | 53 | 1 | 3 | 75 | 5,86 | 93 | 7 | |
| 1 | 0 | 0 | 1 | 1 | 0 | 0 | 0 | 1 | 1 | 1 | 0 | 1 | 0 | $+E_1$ volts |
| 2 | 1 | 0 | 1 | 1 | 1 | 0 | 0 | 0 | 1 | 1 | 0 | 1 | 0 | $+E_2$ volts (temporary state) |
| 3 | 0 | 1 | 1 | 1 | 0 | 1 | 1 | 0 | 0 | 1 | 0 | 1 | 0 | Ground (power turnon state) |
| 4 | 0 | 1 | 0 | 1 | 0 | 1 | 1 | 0 | 0 | 0 | 1 | 1 | 0 | $+E_2$ (temporary state) |
| 5 | 0 | 1 | 0 | 0 | 0 | 1 | 1 | 0 | 0 | 0 | 1 | 0 | 1 | Ground |
| 6 | 1 | 0 | 0 | 1 | 1 | 0 | 0 | 0 | 1 | 0 | 1 | 1 | 0 | $+E_2$ volts |
| 2 | 1 | 0 | 1 | 1 | 1 | 0 | 0 | 0 | 1 | 1 | 0 | 1 | 0 | $+E_2$ volts |

TABLE I-continued

| Circuit State | Input Signal Level | | | | Operating State of Devices | | | | | | | | Output Level Or Condition |
|---|---|---|---|---|---|---|---|---|---|---|---|---|---|
| | A | B | C | D | 49 | 51 | 53 | 1 | 3 | 75 | 5,86 | 93 | 7 | |
| | | | | | | | | | | | | | | (temporary state) |

NOTES:
1. For input signal levels, 0 = -V volts, 1 = ground;
2. For transistor 49 and Darlingtons 1,3,5,7,49,51,53,75,93, 0 = turned off, 1 = turned on;
3. In state 6 current can flow bidirectionally between terminals 13 and 19.
4. Resistive load (not shown) assumed connected between terminal 19 and ground.

From this table it can be seen that state 1 is obtained by operating controller 97 for producing a digital coding of 0,0,1,1, for input signals A,B,C,D, respectively, a digital 0 corresponding to a level of $-V$, and a digital 1 corresponding to ground. Transistor 49 and Darlington switch 53 are turned off in response to the levels of input signals A,B, respectively. With Darlington switch 53 turned off, the impedance between its collector and emitter electrode current path is substantially high, preventing Darlington switch 51 from turning on. The nonconduction of transistor 49 and Darlington switch 53 causes the voltage at circuit point 69 to approach substantially $+E_1$ volts, whereby current flows from the capacitor bootstrap source supplying $(E_1+E_2)$ at the cathode of diode 31 through the current paths including resistor 35, and resistor 37 into the base electrodes of Darlington switches 1 and 3, respectively, turning both of them on. In state 1, the nonconduction of Darlington switch 51 allows the voltage at the circuit point 71 to approach $+E_1$ volts, whereby the current flowing from the bootstrap capacitor 29 through the current path including resistor 35, into the base electrode of Darlington switch 3, causes this switch to be on concurrently with Darlington switch 1. The ground level signals applied to the base electrodes of Darlington switches 75 and 93, via input signals C,D, respectively, causes these switches to turn on. With Darlington switch 75 turned on, a voltage having a level of about $(+E_2)$ volts is applied in reverse bias across resistor 79 causing the current flowing from $+E_1$ through resistor 82 to go through 79 keeping Darlington 5 off, and transistor 86 off. With Darlington switch 93 turned on, the impedance between its collector and emitter electrodes is substantially reduced, for applying about $-V$ volts to the base electrode of Darlington switch 7, holding it off.

When switches 1 and 3 are turned off, bootstrap capacitor 29 charges to approximately $+E_2$ volts via a charging current path including resistor 33, diode 31, a load (not shown) connected between terminal 19 and ground (assumed in this example), and/or primarily the collector-emitter current paths of Darlington switches 5 and 7, when these switches are concurrently turned on. With Darlington switches 1 and 3 concurrently conducting in state 1, the operating voltage $+E_1$ is substantially applied to output terminal 19.

To go from state 1 into state 2, it is necessary to change the level of input signal A from a digital 0 level to a digital 1 level or ground, the levels of input signals B,C and D remaining as in state 1. Transistor 49 responds by turning on, thereby substantially reducing the impedance between its collector and emitter electrodes, creating a reverse bias voltage of substantially $(E_2+V)$ to be applied across Zener diode 65, causing the Zener diode to conduct which in turn causes the voltage at terminal 69 to be reduced to $+E_2-V$ volts. This draws the current flowing through resistor 35 from the base electrode of Darlington switch 1 through the current conduction path including Zener diode 65, limiting resistor 57, diode 63, the collector-emitter current path of transistor 49, and bias voltage terminal 67 into the voltage source supplying the bias voltage $-V$ causing Darlington switch 1 to turn off.

To go from state 2 to state 3, the levels of input signals C,D remain as in states 1 and 2, first the level of input signal B goes from a digital 0 to a digital 1 level, and then the level of A goes from a digital 1 to a digital zero; this causes transistor 49 to turn off and as transistor 49 turns off, Darlington switch 53 turns on. With transistor 49 turned off, Darlington switch 51 remains on via the flow of current into the base electrode of Darlington switch 51 from the voltage source supplying $+E_2$ volts. Because Darlington 53 is on, the current flowing through resistors 35 and 37 is shunted to $-V$ via the current paths including resistors 57 and 59, respectively.

To operate the circuit of FIG. 2 from its state 3 into its state 4 the level of input signal C is changed from a digital 1 to a digital 0, while retaining the levels of input signals A,B and D as in state 3. In response to the level of input signal C going to digital 0, Darlington switch 75 is turned off, causing the level of voltage at circuit point 85 to go above $+E_2$ and transistor 86 to turn on, and current to flow from the operating voltage source applying $+E_1$ volts to terminal 9, through resistor 81 and transistor 86 into the base electrode of Darlington switch 5, turning on this switch.

In order to place the circuit of FIG. 2 into its state 5 from its state 4, it is necessary to operate controller 97 for changing the level of input signal D from a digital 1 to a digital 0, while retaining the levels of the other input signals A,B and C as in state 4. In response to this change in the level of input signal D, Darlington switch 93 turns off permitting current to flow from the voltage supply supplying $+E_2$ volts at terminal 13, through resistor 91, into the base electrode of Darlington switch 7, turning on this switch, causing a source of reference potential or voltage applied to terminal 11 to be applied to output terminal 19 via the substantially low impedance current paths provided by the conduction of Darlington switches 5 & 7.

To change the state of the circuit of FIG. 2 from state 5 to state 6, it is necessary to operate controller 97 for changing only the level of input signals A and D from digital 0 to digital 1, with B and C remaining as in state 5. Accordingly, it should be clear from the above discussion, transistor 49 turns on, Darlington switches 51, 53 and 7 turn off, Darlington switches 3 and 93 turn on, Darlington switch 1 remains turned off, and Darlington switch 5 remains turned on.

It should be noted that in the design of the first buffer switching amplifier, diodes 61 and 63 provide clamping of the common connection between Darlington switches 51 and 53 to a voltage level not exceeding $+E_2$ volts. In this manner, the transistors and the Darlington switches 51 and 53 can have a $V_{CEX}$ breakdown voltage rating that is substantially less than the level of the operating voltage $+E_1$ plus the absolute value of the bias voltage $-V$. In other words, the $V_{CEX}$ rating of Darlington switch 51 can be set at about the value equivalent to the difference between the operating voltage level $+E_1$ and the voltage level of the clamping voltage $+E_2$, whereas the $V_{CEX}$ rating of Darlington switch 53 can be set at a value equal to the sum of $(E_2+V)$. Without the inclusion of the clamping diodes 61 and 63, whenever the Darlington switches are turned on, the base electrodes of Darlington switches 1 and 3 can rise to approach the level of the operating voltage $+E_1$, causing the level of the voltages at the collectors of Darlington switches 51 and 53 to approach $+E_1$ volts, whereby these transistors would have to have at least $V_{CEX}$ breakdown voltage ratings equal to $+E_1$, and $(+E_1+V)$, respectively.

With reference to Table I and the previous discussion of the operation of the circuit of FIG. 2, the timing diagram of FIG. 3 shows waveforms 99, 101, 103 and 105 that can be used for the input signals A,B,C,D, respectively, for operating the switching amplifier of FIG. 2 in driving an inductive load connected to output terminal 19, such as the winding of a motor, where the switching amplifier must be operated sequentially and in ascending or descending order through its first through fifth states to prevent damage to the motor winding as previously mentioned. With reference to FIG. 3, prior to time $t_1$ the switching amplifier of FIG. 2 is in state 1, for applying the operating voltage $+E_1$ to the motor winding, in this example. Between times $t_1$ and $t_2$, the amplifier is placed in state 2, and next in its alternative state 2 between times $t_2$ and $t_3$. Between times $t_3$ and $t_4$, the switching amplifier is placed in tis state 3, for a very short period of time as shown, wherein any inductive kickback from the motor winding is conducted via the current paths of diodes 21 and 23 to the operating voltage supply providing $+E_1$ volts at terminal 9 for positive kickback, and via diodes 25 and 27 for conducting current from ground to output terminal 9 for negative kickback. Between times $t_4$ and $t_5$, the switching amplifier is placed in its state 4 for conducting current from the load to the clamping voltage supply via the current path including the collector-emitter electrodes of Darlington switch 5 and diode 17. Between times $t_5$ and $t_6$, the switching amplifier is placed in its fifth state, for stopping the motor load or discharging the charged inductance of the motor winding to ground via the conduction paths of the turned-on Darlington switches 5 and 7. The motor is brought back up to speed by sequencing the switching amplifier from its state 5 to its state 4 between times $t_6$ and $t_7$, to its state 3 between times $t_7$ and $t_8$, to alternative state 2 between times $t_8$ and $t_9$, to normal state 2 between times $t_9$ and $t_{10}$, and lastly to state 1 after time $t_{10}$. It should be noted that the timing diagram of FIG. 3 is given only as an example, wherein other sequencing of the switching amplifier of FIG. 2 through its various states may be required for driving other types of motors or different types of loads.

In FIG. 4, the circuit embodiment of FIG. 1 is shown with $+E_1$ being provided by batteries 99–102 connected in series between terminals 9 and 13 ($+E_1=+4E$ in this example). Similarly, a stack of batteries 103–106 is connected in series between terminals 11 and 13 for applying $-4E$ volts to terminal 11. Terminal 13 is connected to ground in this latter example. Note that in FIG. 4, for purposes of illustration, a balanced system is shown and each one of the batteries 99 through 106 has a voltage of E volts. The individual batteries 99 through 106 can be replaced by any source of DC voltage for supplying the voltages $+4E$ and $-4E$ volts, respectively, of this example. For loads requiring symmetrical drive, it is in general preferable to operate the switching circuit of FIG. 4 in a balanced mode, but in certain applications it may be necessary to switch unequal levels of positive and negative voltage and to use DC voltage sources producing unequal levels of DC voltage. As will be clear from the following explanation, the individual batteries 99 through 106 are shown connected in series, instead of a single battery for supplying $+4E$ volts and another single battery for supplying $-4E$ volts, for purposes of illustrating how the circuit of FIG. 4 can be progressively expanded via the inclusion of additional switches and diodes for switching progressively greater levels of positive and negative voltages.

TABLE II

| Fig. No. | Circuit State | Operating State of Devices | | | | | | | | Output Level or Condition |
|---|---|---|---|---|---|---|---|---|---|---|
| | | 1 | 3 | 5 | 7 | 113 | 114 | 119 | 120 | |
| 4 | 1 | 0 | 1 | 1 | 0 | — | — | — | — | O; See note (1) |
| | 2 | 1 | 1 | 0 | 0 | — | — | — | — | +4E volts |
| | 3 | 0 | 0 | 1 | 1 | — | — | — | — | −4E volts |
| 5 | 1 | 0 | 1 | 1 | 0 | 0 | 0 | — | — | See note (2) |
| | 2 | 1 | 1 | 1 | 0 | 0 | 0 | — | — | +2E volts |
| | 3 | 1 | 1 | 0 | 0 | 1 | 0 | — | — | +6E volts |
| | 4 | 0 | 1 | 1 | 1 | 0 | 0 | — | — | −2E volts |
| | 5 | 0 | 0 | 1 | 1 | 0 | 1 | — | — | −6E volts |
| 6 | 1 | 0 | 1 | 1 | 0 | 0 | 0 | 0 | 0 | See note (3) |
| | 2 | 1 | 1 | 1 | 1 | 0 | 0 | 0 | 0 | 0; see note (1) |
| | 3 | 1 | 1 | 1 | 0 | 1 | 0 | 0 | 0 | +4E volts |
| | 4 | 1 | 1 | 0 | 0 | 1 | 0 | 1 | 0 | +8E volts |
| | 5 | 0 | 1 | 1 | 1 | 0 | 1 | 0 | 0 | −4E volts |
| | 6 | 0 | 0 | 1 | 1 | 0 | 1 | 0 | 1 | −8E volts |

NOTES:
(1) Output terminal 19 clamped to ground for bidirectional current flow between terminals 13 and 19
(2) Output terminal 19 clamped to +2E volts and −2E volts
(3) Output terminal 19 clamped to +4E volts and −4E volts In Table II, the primary circuit states for the operation of the circuit of FIG. 4 is shown. In circuit state 1 the switches 3 and 5 are operated to their closed position for connecting a source of reference potential, ground in this example, to output terminal 19. Taking into account the voltage drops between terminals 13 and 19, for current flowing from ground to output terminal 19, the voltage at output terminal 19 will be below ground by a level corresponding to the sums of the voltage drops across diode 15 and the main current conduction path of switching device 3. Similarly, for current flowing from output 19 to terminal 13, the level of voltage at output terminal 19 will be above ground by an amount equal to the sum of the voltage drops across the main current conduction path of switching device 5 and diode 17. As previously described, with the switching devices 3 and 5 operated to their closed positions concurrently with switches 1 and 7 in their open positions, bidirectional current flow is provided between terminals 13 and 19. In circuit state 2, switching devices 1 and 3 are operated to the closed position, with switches 5 and 7 in their open positions, for applying +4E volts to output terminal 19. If the voltage across the load happens to increase to a level greater than +4E volts, as may occur with an inductive load, then current will flow from the load through terminal 19 and switches 3 and 1, through the batteries 99 through 102, to ground. Note that as previously mentioned for FIG. 2, an individual diode would normally be connected in inverse or antiparallel across each one of the switches of FIGS. 1 and 4 through 6, for providing bilateral switching in the circuits; that is, for providing a continuous flow of current through reactive loads that are being supplied power by the switching circuit, even when the individual switches of the switching circuit are operated to their open positions. For example, if switches 1 and 3 are concurrently operated to their closed positions with switches 5 and 7 in their open positions, for supplying current to an inductive load, and then switches 1 and 3 are suddenly opened, the inductive load in trying to maintain the flow of current in the same direction, "kicks back" a voltage to a level more negative than −4E volts, causing current to flow through the diodes connected in antiparallel across the switches 5 and 7, and therefrom from ground through the batteries 103 through 106. In circuit state 3, the switches 5 and 7 are operated to their closed positions concurrent with switches 1 and 3 being in their open positions, for applying −4E volts to output terminal 19. If at this time the voltage across the load happens to decrease to a value lower than −4E volts, then current will flow from ground through the batteries 103 through 106, switches 5 and 7, out of terminal 19 and into the load, instead of as in the normal mode of operation where current flows in the opposite directions. The switches 1,3,5 and 7 of FIG. 4 must have an open circuit voltage rating of at least 4E volts. This is determined by noting that when the upper switches 1,3 are operated to their closed positions with the lower switches 5,7 in their open positions, or vice versa, that the switches in their open circuit condition will have a voltage of 8E volts applied across their open circuit current conduction paths connected in series. Assuming that the open circuit impedances of the switches are substantially matched, each then must have an open circuit voltage capability of about ½ that of the maximum voltage that can be applied across their main current paths connected in series.

In FIG. 5, another embodiment of the invention is shown, for switching up to +6E or −6E volts to a load connected to terminal 19. In comparison to FIG. 4, the circuit of FIG. 5 includes the addition of diodes 111 and 112, and switches 113 and 114. The circuit connections of FIG. 5 for certain of the components are different from the connections of these components in FIG. 4, but follow a definite pattern that will be obvious from the following discussions. In Table II, the primary circuit states for FIG. 5 corresponding to concurrent operation of the switches 1,3,5,7,113 and 114 to various combinations of their respective open and closed conditions are shown. From Table II, it can be seen that the circuit of FIG. 5 is operable for applying either ground, +2E volts, +6E volts, −2E volts or −6E volts to output terminal 19. To avoid current surges, and reduce the possibility of transients, it is preferred that circuit state 3 be obtained by first placing the circuit in state 1, then state 2, and finally into state 3. In other words, it is preferred that the circuit of FIG. 5 be operated for going from one state into any other state by operating the switches of the circuit for placing the circuit in succeedingly higher or lower voltage states in sequential order, to reduce the changes in the level of the output voltage to a minimum in switching between states. For example, in changing the output voltage from +6E volts to −6E volts, the circuit is progressively switched from state 3, to state 2, to state 1, to state 4 and finally to state 5, instead of directly from state 3 to state 5. Also, it is important that break-before-make switching be used to avoid the possibility of shorting any of the batteries 107 through 110 to ground or to each other. In the circuit embodiment of FIG. 5, each one of the switches 1,3,5,7, 113 and 114 must have an open circuit voltage rating of at least 4E volts. This is determined by simultaneously closing the upper three switches 1,3,113 with the lower three switches 5,7,114 open, or vice versa, and noting that the voltage across the series combination of the three open switches has a level of 12E. Again, assuming the "off-impedances" of the switches 1,3,5,7,113 and 114 are substantially matched, then by dividing 12E by 3, it is determined that the open circuit rating for each one of these switches is 4E volts.

Other alternative embodiments of the invention for switching between a maximum of +NE or −NE volts can be obtained by adding additional switches and diodes, as required, in a fashion as shown in FIG. 6. N is any even number other than 2, i.e. 4,6,8,10, . . . This circuit extension is indicated by the vertical dashed lines at the top and bottom portions of the circuit of FIG. 6. If it is required that +NE or −NE volts be switched by this circuit, then N batteries are required in both the upper half of the circuit above terminals 13-19, and in the lower portion of the circuit below these terminals 13,19. Also, the number of switches required in each one of the upper and lower halves of the circuit is equal to N divided by 2; and the number of diodes required in each of the upper and lower halves of the circuit is one less than the number of switches [(N/2) −1]. The batteries in the upper and lower portions of the circuit are connected in series as shown for providing the operating voltages +NE or −NE volts, respectively. The main current conduction paths of the switching devices in the upper half of the circuit are connected in series between the operating voltage terminal 9 and output terminal 19. The switching devices in the lower half of the circuit have their main current conduction paths connected in series between the operating voltage terminal 11 and output terminal 19. The common connection between the uppermost two switches in the upper half of the circuit is connected via a diode to the common connection between the uppermost four batteries to the chain of batteries immediately below, whereby the diodes in the upper section of the circuit are polarized for passing current from the battery chain to the switches. The common connection between the uppermost four batteries and the lower portion of the chain of the batteries is also connected via a diode in the lower portion of the circuit to the common connection between the uppermost two switches in the lowermost portion of the circuit, this latter diode being oppositely polarized than the former diode, for conducting current from the lower switching bank to the battery chain. The common connection between the second and third uppermost switches of the upper circuit is connected by a diode to the common connection between the bottom of the second group of four batteries (with reference to the uppermost group of four batteries) and the third group of four batteries, this common connection of batteries also being connected via an oppositely polarized diode to the former to the common connection between the second and third uppermost switches of the lower portion of the circuit, and so forth. This pattern of interconnecting batteries, diodes and switches can be continued to the Nth level, as would be apparent to one skilled in the art. As shown, the common connection between the batteries in the upper half of the circuit and the lower half of the circuit are connected to terminal 13 for receiving a source of reference voltage, in this example, ground. In other words, the batteries are connected in series between operating voltage terminals 9 and 11, and their centermost voltage point is connected to reference voltage terminal 13. Similarly, the main current conduction paths of the switches are connected in series between operating voltage terminals 9 and 11, and the centralmost point of these series-connected switches is connected to the output terminal 19.

To further illustrate the progression of adding additional switches, diodes and batteries for switching progressively higher levels of voltage in alternative embodiments of the invention, assume that N is equal to 8. The resulting circuit would be as shown in FIG. 6, but with the dash lines made solid. This latter circuit is the next progression from the circuit of FIG. 5, and in comparison to FIG. 5 includes the addition of switches 119 and 120, diodes 121 and 122, and batteries 115 through 118. It should be noted that N must be an even number. The primary circuit states for this latter circuit are shown in Table II, for obtaining 0, ±4, or ±8E volts at terminal 19. With reference to FIGS. 4, 5 and 6 and Table II, it is apparent that for the Nth degree embodiment of the invention (N/2+1) different levels of output voltage are obtainable.

For the switching circuit of the Nth degree embodiment of FIG. 6, the voltage rating for the switching devices is obtained as before, by closing all of the switches in the upper half of the circuit, with the switches of the lower half being open, or vice versa, and noting that 2NE volts is applied across the bank of open-circuited switches, the number of these switches being N/2, this number being divided into 2NE for obtaining the voltage rating of each switch as 4E volts (assuming the switching devices are similar). Each one of these N/2 switches can be provided by any switching device capable of providing single-pole-single-throw switching action, such as transistors, silicon-controlled rectifiers, electromechanical relays, and so forth. Note that in a practical system, where the circuit of FIG. 6 is operated for supplying power to reactive loads such as a motor, it is desirable to place individual diodes in inverse parallel with each one of the switching devices, for obtaining bilateral switching action, as previously mentioned.

It has been shown that the embodiment of the invention of FIG. 4 can be expanded into alternative other embodiments of the invention for switching progressively greater voltages via the addition of more switching devices and diodes, as required. To increase the current-carrying capability of the present switching circuit and its various embodiments, additional switching devices can be added in parallel with the present switching devices, as would be understood by one skilled in the art. Also, by closing and opening the switching devices in a periodic fashion and repetitive pattern, the DC operating voltages can be converted into a step-like AC waveform at output terminal 19. To obtain the conversion of a DC voltage or voltages into threephase AC, three of the present switching circuits can be operated from the same DC voltage source(s), and periodically switched in a given pattern 120° out of phase with one another. Also, two similar embodiments of the present invention can be connected into a bridge-like configuration, for providing a bridge converter circuit, such as taught in my co-pending application Ser. No. 944,608 filed Sept. 21, 1978, for BRIDGE CONVERTER CIRCUIT.

For purposes of the following discussion, a gated power path is defined as a current conduction path between a source of voltage and an output terminal, whereby the conduction path includes switching means for selectively opening and closing the conduction path. Similarly, a gated ground path is herein defined as a current conduction path between a source of reference potential, in this case ground, and an output terminal, wherein the current conduction path includes switching means permitting selective opening and closing of the current conduction path. Accordingly, with reference to FIGS. 4, 5 and 6 note that when N/2 is odd, such as in FIG. 5, where N is equal to 6, only gated power paths are provided. For example, in FIG. 5, the combination of switching device 5, diode 17, and batteries 101 and 102, form a gated power path, for connecting output terminal 19 to +2E volts whenever switching device 5 is operated to its closed position. With switch 5 in its closed position, whenever the voltage across a load connected to output terminal 19 exceeds +2E volts, current flows from the load into terminal 19 and through the gated power path 5,17,101,102 to ground. In FIG. 6, for N equal to 8, N/2 is of course even, and both gated ground and power paths are present in the resulting circuit. For example, in FIG. 6 the combination of switching devices 1 and 3 and diode 111 form a gated ground path between terminal 13 and output terminal 19. Whenever switches 1 and 3 are operated to their closed positions, current can flow from ground to output terminal 19 via the latter gated current path. Similarly, switching devices 5 and 7 in combination with diode 112 form a gated current path for current flow in the opposite direction whenever switches 5 and 7 are operated to their closed positions.

In FIG. 7 there is shown a switching circuit preferred for use in providing each individual single-pole-single-throw switching device shown in the circuits of FIGS. 1,4,5 and 6 of the present invention. This switching circuit is the subject of applicant's co-pending application Ser. No. 944,632, filed on Sept. 21, 1978 for FLOATING TRANSISTORIZED SWITCH, where the operation and circuit is described in detail. Applicant developed this switching circuit specifically to overcome the problems in the prior art in obtaining reliable operation of switching circuits having more than two transistors connected in cascode for switching relatively high levels of voltage. Important features of the switching circuit of FIG. 7 include the optical coupler 200 and local power supply 202. The optical coupler 200 electrically isolates the switching circuit from the source of control signals (a microprocessor, for example) connected between input terminals 204, 206, permitting the levels of voltage at the power terminals 208 and 210 to float up and down independently of the voltage applied across the input terminals 204,206. The local supply 202 includes a transformer 212, which serves both to isolate the source of AC voltage applied between terminals 214 and 216 from other portions of the switching circuit, and to provide via secondary winding a predetermined level of AC voltage for driving the full-wave bridge rectifier of diodes 218-221. The center tap of the secondary winding of the transformer 212 is connected in common to power terminal 210 and filter capacitors 222 and 224, thereby referencing the DC operating voltages $+V$ and $-V$ to whatever voltage is applied to the power terminal 210. These operating voltages $+V$ and $-V$ are applied to operating voltage rails or buses 226, 228, respectively. Referencing of the operating voltages $+V$ and $-V$ to the voltage applied to power terminal 210 ensures that the operating voltage levels will remain at the proper operating levels relative to the voltage at power terminal 210, thereby permitting the switching circuit to be included at any position within a cascoded chain or string of such switching circuits as shown in FIGS. 1,4,5 and 6.

Operation of the circuit of FIG. 7 will now be described. Assume that the switching circuit is turned off, in which condition the Darlington Circuit 230,231 is turned off, thereby causing a substantially high impedance to exist between power or output terminals 208 and 210. This is analogous to an open single-pole-single-throw switch having contacts represented by terminals 208 and 210. To turn on the switching circuit, a control signal is applied between input terminals 204 and 206, for causing a current $i_T$ to flow as shown through the current-limiting resistor 205 and the light-emitting diode 232 of the optical coupler 200. In response to this flow of current, diode 232 emits infrared radiation which is detected by the photodiode 234. The photodiode 234 responds to this light by substantially lowering its impedance, thereby permitting current to flow from the voltage rail 226 (the $+V$ voltage side of local supply 202) into the base electrode of transistor 236 of the optical coupler 200, and through the resistor 238 to the $-V$ operating voltage rail 228, causing transistor 236 to turn on. When transistor 236 so turns on, current flows from the positive voltage rail 226, through resistor 240 and the collector-emitter current path of transistor 236 to the negative voltage rail 228, in turn causing the level of voltage at the input terminal of inverter 242 to decrease in potential from substantially $+V$ to $-V$ volts. In response to this drop in voltage at its input terminal, inverter 242 changes the level of the voltage at its output terminal from a relatively low level to a relatively high level. Inverter 244 changes the condition of the level of its output signal from a relatively high level to a relatively low level about $-V$ volts, in response to the change in the level of the output signal from inverter 242, thereby "pulling down" the base electrode of Darlington transistor 246, the latter remaining in a saturated state because of minority charge carrier storage in its base region. Before Darlington transistor 246 becomes unsaturated because of the recombination of minority carriers in the base region, inverter 248 changes the level of its output signal from a high level to a low level, in response to the change in the level of the output signal from inverter 242. Inverter 250 changes the level of its output signal from a low level to a high level with a time delay determined by the values of resistor 252 and capacitor 254, in response to the low level output signal from inverter 248. When the now positive-going output signal from inverter 250 exceeds the input threshold level of inverter 256, the latter responds by changing the level of its output signal from a high level to a low level, causing current to flow from the positive rail 226 through resistors 258 and 260 into the output terminal of inverter 256, and from the base electrode of transistor 262 through current-limiting resistor 260 into the output terminal of inverter 256. In this manner, transistor 262 is turned on about two microseconds after the change in the output signal of inverter 242 from a low level to a high level. When transistor 262 so turns on, substantially $+V$ volts is applied via the emittercollector current path of transistor 262 (now having a substantially low impedance), and the combination of resistor 264 in parallel with the series circuit of capacitor 266 and resistor 268, to the collector electrode of Darlington transistor 246, causing the latter to come out of saturation and turn off. When Darlington transistor 246 comes out of saturation, the large transient current flowing through capacitor 266 and resistor 268 (controls magnitude of current) flows into the base electrode of transistor 230, overdriving the Darlington circuit 230,231 to cause it to turn on in a substantially short period of time (transistors 230 and 231 turned on). After the turnon overdrive transient current subsides due to the charging of the speedup capacitor 266, the magnitude of the base current applied to the base electrode of transistor 230 is controlled by the value of resistor 264 for maintaining the Darlington circuit 230,231 turned on. When the Darlington circuit 230, 231 so turns on, the impedance between the collector and emitter electrodes of transistor 231 is substantially reduced, for connecting power terminal 208 to output terminal 210, permitting current to flow therebetween. At this time, in response to the low level of output signal from inverter 248, inverter 270 is producing a high level of output signal for application via resistor 272 to the base electrode of transistor 274, keeping this transistor turned off.

When the switching circuit of FIG. 1 is operated as described above for turning on the output Darlington 230, 231, and thereafter, it is desired to turn off this Darlington circuit, the input signal applied across terminals 204 and 206 is removed to interrupt the current $i_T$ flowing through the light-emitting diode 232. Next, in sequential order, the impedance of photodiode 234 substantially increases, preventing the flow of base current for transistor 236, causing transistor 236 to turn off. When transistor 236 turns off, the voltage at its collector electrode rises toward the positive rail 226, causing about $+V$ volts to be applied to the input terminal of inverter 242, the latter responding by changing the level of its output signal from a high level to a low level, the inverters 244 and 248 responding thereto by changing the level of their output signals from a low level to a high level. When the output signal from inverter 248 goes high, inverter 270 responds thereto by changing the level of its output signal from a high level to a low level, permitting current to flow from the positive rail 226 through the resistors 276 and 272 into the output terminal of inverter 270. Also, base current flows from transistor 274 through resistor 272 into the output terminal of inverter 270, thereby turning on transistor 274, causing a large transient current to flow from the positive rail 226 through the collector-emitter current path of transistor 274, and substantially through the speedup circuit of capacitor 278 and resistors 280 and 282, into the base electrode of Darlington transistor 246, thereby providing fast turnon of this Darlington transistor. The time constant of the speedup circuit 278,280,282 is such that shortly after the Darlington transistor 246 turns on, capacitor 278 charges, and the sustaining current for keeping on the Darlington transistor 246 is provided via resistor 282 and the collector-emitter current path of transistor 274 from the positive rail 226. The hard turnon of Darlington transistor 246 overrides the static "on current" flowing from resistor 264 into the base electrode of transistor 230, and causes a large current to flow out of the bases of transistors 230 and 231, with the base current from transistor 231 flowing into the collector electrode of Darlington transistor 246 via the current path provided by diodes 284 and 286. This causes the output Darlington 230, 231 to go out of saturation and rapidly turn off with correspondingly low turned-off power dissipation. Note that at the same time after Darlington transistor 246 turns on, inverter 250 changes its output signal from a high level to a low level, in response to the high level output signal from inverter 248. Inverter 256 changes the level of its output signal from a low level to a high level, in response to the change in level of the output signal from inverter 250, thereby turning off transistor 262. Also note that resistors 288 and 290 serve as "pull-up" resistors for inverters 248 and 250, respectively; that resistors 292 and 294 serve as biasing resistors; and that diode 296 permits the collector-base junctions of transistors 230 and 231 to be discharged when the $V_{CE}$ across these transistors drops from a high positive to a relatively low positive value. The antiparallel diode 298 across Darlington circuit 230,231 is included to provide bilateral current flow for the Darlington switching circuit 230,231, whereby when the switching circuit turns off current can flow from reactive loads connected to output terminal 210 through diode 298 and into power terminal 208. To connect a plurality of switching circuits identical to FIG. 7 in cascode, the terminal 208 of a first individual circuit is connected to the terminal 210 of a second individual circuit, and the terminal 210 of the first individual circuit is connected to the terminal 208 of a third individual circuit, and so forth.

What is claimed is:

1. A bipolar nonlinear switching amplifier, comprising:

first through fourth like conductivity transistor switch means connected sequentially in cascode, each having a base, collector, and emitter electrodes, said base electrodes being receptive of first through fourth control signals, respectively, an operating voltage $E_1$ being applied to one end of said cascode combination, a source of reference voltage being applied to the other end of said cascode combination;

a primary output terminal connected to the common connection of said second and third transistor switch means;

first diode means connected between the common connection of said first and second switch means and a first source of bias voltage having a voltage level of $E_2$ volts and the same polarity as said operating voltage, said first diode means being polarized for providing in combination with said second transistor switch means a gated current path, for selectively passing current in one direction between said source of bias voltage and said output terminal; and second diode means connected between said source of bias voltage and the common connection of said third and fourth switch means, said second diode means being polarized in the opposite direction as said first diode means, for providing in combination with said third transistor switch means a gated current path for selectively passing current in the opposite direction between said source of bias voltage and said output terminal;

the difference in voltage between said operating voltage $E_1$ and bias voltage $E_2$ being less than the $V_{CEX}$, the breakdown voltage from collector to emitter with some backbias voltage applied to the base electrode of each one of said first through fourth transistor switch means, whereby the combination of said first through fourth transistor switch means are operable to a first state where said first and second switch means are turned on and said third and fourth switch means turned off, for applying said operating voltage $E_1$ to said primary output terminal, to a second state where only said second switch means is turned on, to a third state where all of said first through fourth switch means are turned off, to a fourth state where only said third switch means is turned on, and to a fifth state where only said third and fourth switch means are turned on for applying said reference voltage to said primary output terminal, the combination of said first through fourth transistor switches being operable from any one to another of said first through fifth states, for permitting switching of said operating voltage $E_1$ having a value substantially greater than the $V_{CEX}$ rating of each one of said first through fourth transistor switch means, and also being operable from either one of said second, third and fourth states directly to a sixth state in which only said second and third transistor switch means are turned on for providing bidirectional current flow between said source of bias voltage and said output terminal.

2. The switching amplifier of claim 1, further including control means for producing said first through fourth control signals for selectively operating said amplifier to a desired one of said first through sixth states of the combination of said first through fourth transistor switch means.

3. The switching amplifier of claim 2, wherein said control means includes a microprocessor programmed for directing the operation of said control means in producing said first through fourth control signals.

4. The switching amplifier of claim 2, further including third through sixth diode means connected in inverse parallel across the collector and emitter electrodes of said first through fourth transistor switch means, providing bilateral current flow in the output stage of said switching amplifier.

5. The switching amplifier of claim 4, wherein said control means includes:

seventh diode means connected across the base and emitter electrodes of said first transistor switch means, and polarized for ensuring a backbias voltage of at least one diode drop across the base-emitter electrodes of said first switch means, whenever said first control signal has a voltage level for turning off said first switch means; and buffer amplifier means connected between said first source of bias voltage and a second source of bias voltage of opposite polarity to the former, and having first and second output terminals connected to the base electrodes of said first and second switch means, respectively, said buffer means being operable to either one of a first condition for producing said first and second control signals at its first and second output terminals, respectively, for turning off said first and second switch means as in the third through fifth states of said switching amplifier, a second condition for producing said first and second control signals for turning off said first switch means, and turning on said second switch means, as in the second and sixth states of said switching amplifier, and a third condition for producing said first and second control signals for turning on said first and second switch means.

6. A switching circuit for operating switching transistors at greater than their rated voltage, and for supplying current to or sinking current from both resistive and complex impedance loads, comprsing:

a first terminal for receiving an operating voltage of $+E_1$ volts;

a second terminal for receiving a source of reference potential;

a third terminal for receiving a voltage of $+E_2$ volts;

a primary output terminal for connection to a load;

first through fourth NPN switching transistor means each having a base electrode receptive of first through fourth control signals, respectively, a collector electrode, and an emitter electrode, said first through fourth switching transistor means being connected in cascode with the collector electrode of said first switching transistor means being connected to said first terminal, the emitter electrode of said fourth switching transistor means being connected to said second terminal, and the emitter and collector electrodes of said second and third switching transistor means, respectively, being connected in common to said output terminal;

first diode means connected between the common connection of said first and second switching transistor means and said third terminal, and polarized for clamping the latter common connection from going less negative than $+E_2$ volts;

second diode means connected between the common connection of said third and fourth switching transistor means and said third terminal, and polarized for clamping the latter common connection from going more positive than $+E_2$ volts, whereby the difference in voltage between $+E_1$ volts and $+E_2$ volts is less than the $V_{CEX}$, *the breakdown voltage from collector to emitter with some backbias voltage applied to the base, of each one of said first through fourth NPN switching transistor means*; and control circuit means for selectively producing said first through fourth control signals for operating the combination of said first through fourth NPN switching transistor means into one of first through fifth different states, wherein in said first state only said first and second switching means are turned on, thereby applying $+E_1$ volts to said output terminal, in said second state only said second switching means is turned on, in said third state each one of said first through fourth switching means is turned off, in said fourth state only said third switching means is turned on, and in said fifth state only said third and fourth switching means are turned on, whereby said reference voltage is applied to said output terminal;

the combination of said control means and said first and second diode means permitting switching of said operating voltage $+E_1$ having a voltage level substantially exceeding the $V_{CEX}$ of said first through fourth NPN transistor switching means, the combination of said first diode means and said second switching transistor means providing a gated current path for the flow of current from said third terminal to said output terminal, in said second state, and the combination of said second diode means and third transistor means providing a gated current path for the flow of current from said output terminal to said third terminal, in said fourth state.

7. The switching circuit of claim 6, wherein said control circuit means includes means for producing said first through fourth control signals for operating the combination of said first through fourth NPN switching transistor means from any one of said first through fifth states into a sixth state where only said second and third NPN swtiching transistor means are turned on, thereby providing bidirectional current flow between said third terminal and said output terminal.

8. The switching circuit of claim 7, wherein said control circuit means includes a microprocessor programmed for automatically operating said control circuit means to produce said first through fourth control signals.

9. The switching circuit of claim 7, wherein said control circuit means includes:

a fourth terminal for receiving a bias voltage of $-V$ volts;

third diode means having a cathode and anode electrodes connected to the base and emitter electrodes, respectively, of said first NPN switching transistor means;

buffer switching amplifier means connected between said third and fourth terminals, having first and second output terminals connected to and for supplying said first and second control signals to the base electrodes of said first and second switching transistor means, respectively, said buffer means being operable to a first condition for connecting said bias voltage to these base electrodes, thereby providing a pull-down current path from these base electrodes to a voltage source supplying said bias voltage for turning off said first and second switching transistor means, said buffer means being operable to a second condition for supplying current from a voltage source providing said $+E_2$ volts to the base of said second switching transistor means, turning on the latter, while concurrently providing the pull-down current path from the base of said first switching transistor means to said source of bias voltage, said buffer means being operable to a third condition for concurrently supplying current from said source of $+E_2$ volts to the base electrodes of said first and second switching transistor means, thereby turning them on.

10. The switching circuit of claim 9, wherein said buffer switching amplifier means includes:

fifth, sixth, and seventh NPN switching transistor means each having a base, emitter, and collector electrodes, said fifth and seventh switching transistor means having their emitter electrodes connected to said fourth terminal, the base electrodes of said fifth and seventh switching transistor means being receptive of first and second input signals, respectively;

fourth diode means having an anode electrode connected to said third terminal, and a cathode electrode;

first and second current limiting resistive means connected individually between the cathode electrode of said fourth diode means, and the base electrodes of said first and second NPN switching transistor means, respectively;

Zener diode means having an anode electrode connected in common to the emitter and the collector electrodes of said sixth and seventh switching means, respectively, and having a cathode electrode connected to the base electrode of said first switching means;

fifth diode means having an anode electrode connected to the anode electrode of said Zener diode means, and a cathode electrode connected in common to the collector and base electrodes of said fifth and sixth NPN switching transistor means, respectively;

sixth diode means having an anode electrode connected to the collector electrode of said fifth switching transistor means, and a cathode electrode to said third terminal;

a third current limiting resistive means connected in parallel with said sixth diode means; and a fourth current limiting resistive means connected between said second output terminal and the collector electrode of said sixth NPN switching transistor means;

said fifth switching transistor means being turned on in response to a relatively high level of said first input signal, for applying said bias voltage to and "pulling down" the base of said sixth transistor means, turning the latter off, whereby $+E_2$ is substantially applied to said second output terminal via the current path formed by said fourth diode means and second resistive means, said fifth switching means being turned off in response to a relatively low level of said first input signal, for applying $+E_2$ volts to and supplying current to the base of said sixth switching means, turning on the latter, said seventh switching transistor means being turned on in response to a relatively high level of said second input signal, for providing in combination with said Zener diode means a relatively low impedance current path between said first output terminal of said buffer means and said fourth terminal, the voltage across said Zener diode means being sufficient to place said Zener means into reverse breakdown at this time, thereby substantially applying $-V$ to said first output terminal, said seventh transistor means being turned off in response to said second input signal having a relatively low level of voltage, thereby substantially increasing the level of impedance between said first output terminal of said buffer means and said fourth terminal, permitting $+E_2$ volts to be applied to said first output terminal via the current path formed by said fourth diode means and first resistive means, whenever said sixth and seventh transistor means are concurrently turned on said bias voltage $-V$ is substantially applied to said second output terminal via the relatively low impedance current path including said fourth resistive means and the collector-emitter current paths of said sixth and seventh transistor means;

said buffer means being in its first condition whenever said sixth and seventh transistor means are concurrently turned on, in its second condition whenever said fifth transistor means is turned on, and said sixth and seventh transistor means turned off, and in its third condition whenever said fifth, sixth and seventh transitor means are turned off.

said fifth and sixth diode means in combination clamp the common connection between said sixth and seventh transistor means from exceeding $+E_2$ volts, thereby permitting said sixth transistor means to have a $V_{CEX}$ minimum value of $(E_1-E_2)$ volts, and said seventh transistor means to have a $V_{CEX}$ minimum value of $(E_2+V)$.

11. The switching circuit of claim 10, wherein said control circuit means further includes:

second buffer switching amplifier means responsive to a third input signal for producing said third control signal having relatively high and low levels, for digital zero and one levels of said third input signal, respectively;

third buffer switching amplifier means responsive to a fourth input signal, for producing said fourth control signal having a relatively high level for a digital zero level of said fourth input signal, and a relatively low level for a digital one level of said fourth input signal; and microprocessor means programmed for producing said first through fourth input signals for automatic operation of said switching circuit.

12. A nonlinear switching amplifier for switching up to $\pm NE$ volts, where N is an even integer number other than 2 (N=4,6,8,10...) and E is a constant number, comprising:

first and second operating voltage terminals for receiving $+NE$ volts and $-NE$ volts, respectively;

an output terminal;

a plurality of N/2 first switching means each having a main current conduction path, the main current conduction paths of said switching means being connected in series between said first operating voltage and said output terminals, each one of said switching means being selectively and individually operable to a first condition for opening their main current conduction path, and to a second condition for closing their main current conduction path;

a plurality of N/2 second switching means each having a main current conduction path, the main current conduction paths of said second switching means being connected in series between said output and second operating voltage terminals, each one of said second switching means being selectively and individually operable to a first condition for opening their main current conduction path, and to a second condition for closing their main current conduction path;

a plurality of [(N/2)−1] first diodes each having a cathode electrode and an anode electrode;

a plurality of [(N/2)−1] second diodes each having a cathode electrode and an anode electrode;

beginning from the uppermost first common connection between the uppermost two of said N/2 first switching means relative to said first terminal, proceeding sequentially downward to the [(N/2)−1] common connection between the lowermost two of said N/2 first switching means, each one of said [(N/2)−1] first diodes having their cathode electrodes connected to an individual numerically corresponding one of these [(N/2)−1] common connections, and their anode electrodes individually receiving a different and progressively lower level of DC voltage, respectively;

beginning from the uppermost first common connection between the uppermost two of said N/2 second switching means relative to said output terminal, proceeding sequentially downward to the [(N/2)−1] common connection between the lowermost two of said N/2 second switching means, each one of said [(N/2)−1] second diodes having their anode electrodes connected to an individual corresponding numerical one of these [(N/2)−1] common connections, and their cathode electrodes to the anode electrodes of the numerically corresponding one of said [(N/2)−1] first diodes, the values of the different levels of DC voltage being chosen for ensuring that the open-circuit voltage breakdown of said plurality of N/2 first and second switching means is not exceeded, provided that said N/2 first switching means are sequentially closed in order from the lowermost one to the uppermost one, and opened in reverse order, and that said N/2 second switching means are sequentially closed in order from the uppermost one to the lowermost one, and opened in reverse order, these switching means being operable to different combinations of their first and second conditions for producing any one of [(N/2)+1] different levels of output voltage at said output terminal.

13. The nonlinear switching amplifier of claim 12, further including:

a reference voltage terminal for connection to a point of reference potential;

a string of a plurality of DC voltage sources connected in series between said first and second operating voltage terminals, the center of said string of DC voltage sources being connected to said reference voltage terminal, said string of DC voltage sources having [(N/2)−1] voltage taps, whereby, beginning from the uppermost voltage tap relative to said first operating voltage terminal down to the [(N/2)−1] th tap, said taps are individually connected to the anode electrodes of the numerically corresponding ones of said plurality of [(N/2)−1] first diodes, said string of DC voltage sources thereby supplying said ±NE operating voltages and said different levels of DC voltage.

14. The nonlinear switching amplifier of claim 12, wherein each one of said plurality of N/2 first and N/2 second switching means includes a like conductivity transistor having a main current conduction path connected in cascode with the other main current conduction paths of the other (N−1) transistors between said first and second operating voltage terminals, the centralmost common connection between said transistors being connected to said output terminal, each one of said transistors having a control terminal for receiving a control signal for operating it to one of its first and second conditions.

15. A nonlinear switching circuit comprising:

first and second operating voltage terminals;

an output terminal;

a reference voltage terminal for connection to a point of reference potential;

a plurality of DC voltage sources each one producing E volts, connected in series between said first and second operating voltage terminals, the centralmost common connection between said DC voltage sources being connected to said reference voltage terminal, +NE volts being applied by said DC voltage sources to said first operating voltage terminal, and −NE volts to said second operating voltage terminal, said series-connected DC voltage sources having [(N/2)−1] voltage taps, N being an even integer number other than 2(N=4, 6, 8, 10 ...), proceeding down the string of said series-connected DC voltage souces from said first towards said second terminal, each one of said voltage taps provides 4E volts less than the previous tap, beginning with the first tap to the [(N/2)−1] tap;

a plurality of N transistor switches connected in cascode between said first and second terminals, each one of said transistors having a $V_{CEX}$ rating of at least 4E volts, the centralmost common connection between said transistor switches being connected to said output terminal;

a plurality of [(N/2)−1] first diodes each one of which is individually connected between successive ones of said [(N/2)−1] voltage taps and corresponding successive [(N/2)−1] common connections between the ones of said transistors located between said first and output terminals, said diodes being polarized for conducting current from said reference voltage terminal, through the ones of said DC voltage sources therebetween to the associated one of the common connections between said transistors; and a plurality of [(N/2)−1] second diodes, each one of which is individually connected between successive ones of [(N/2)−1] voltage taps and corresponding successive [(N/2)−1] common connections between the ones of said transistors located between said output and second terminals, said second diodes being oppositely polarized to said first diodes;

said transistor switches being operable for providing [(N/2)+1] different levels of output voltage in a range between +NE volts and −NE volts.

* * * * *